United States Patent
Hayashi et al.

(10) Patent No.: US 10,326,461 B2
(45) Date of Patent: Jun. 18, 2019

(54) QUANTUM INTERFERENCE DEVICE, ATOMIC OSCILLATOR, ELECTRONIC APPARATUS, AND MOVING OBJECT

(71) Applicant: Seiko Epson Corporation, Tokyo (JP)

(72) Inventors: Nobuhito Hayashi, Chino (JP); Yoshiyuki Maki, Suwa (JP)

(73) Assignee: Seiko Epson Corporation (JP)

( * ) Notice: Subject to any disclaimer, the term of this patent is extended or adjusted under 35 U.S.C. 154(b) by 156 days.

(21) Appl. No.: 15/463,354

(22) Filed: Mar. 20, 2017

(65) Prior Publication Data

US 2017/0279456 A1  Sep. 28, 2017

(30) Foreign Application Priority Data

Mar. 28, 2016 (JP) ................. 2016-063268

(51) Int. Cl.
| | |
|---|---|
| *G04F 5/14* | (2006.01) |
| *H03B 17/00* | (2006.01) |
| *H03L 7/26* | (2006.01) |
| *H01S 5/00* | (2006.01) |
| *H03L 1/04* | (2006.01) |
| *H01S 5/183* | (2006.01) |
| *H01S 3/13* | (2006.01) |

(52) U.S. Cl.
CPC ................. *H03L 7/26* (2013.01); *G04F 5/14* (2013.01); *H01S 5/005* (2013.01); *H03B 17/00* (2013.01); *H03L 1/04* (2013.01); *H01S 3/1305* (2013.01); *H01S 5/183* (2013.01)

(58) Field of Classification Search
CPC ........... G04F 5/14; G04F 5/145; H03B 17/00; H03L 1/02; H03L 1/04; H03L 7/26
USPC ......................................... 331/3, 68–70, 94.1
See application file for complete search history.

(56) References Cited

U.S. PATENT DOCUMENTS

| | | | |
|---|---|---|---|
| 3,651,394 A * | 3/1972 | Malnar ................ | G01N 24/006 324/304 |
| 4,494,085 A * | 1/1985 | Goldberg ............. | G01N 24/006 324/304 |
| 7,215,213 B2 | 5/2007 | Mescher et al. | |
| 7,956,697 B2 | 6/2011 | Aoyama et al. | |
| 9,995,800 B1 * | 6/2018 | Schwindt ............... | G01R 33/26 |
| 2009/0251224 A1 * | 10/2009 | DeNatale ........... | G02B 27/0961 331/94.1 |

(Continued)

FOREIGN PATENT DOCUMENTS

| | | |
|---|---|---|
| JP | 10-284772 A | 10/1998 |
| JP | 2008-520958 A | 6/2008 |

(Continued)

OTHER PUBLICATIONS

R. Lutwak et al., "The Chip-Scale Atomic Clock—Prototype Evaluation", Proceedings of the 39th Annual Precise Time and Time Interval Meeting, 2007, pp. 269-290.

*Primary Examiner* — Levi Gannon

(74) *Attorney, Agent, or Firm* — Harness, Dickey & Pierce, P.L.C.

(57) ABSTRACT

A quantum interference device has an atomic cell which has alkali metal atoms disposed within. A light source emits light to excite the alkali metal atoms in the atomic cell. An optical element is disposed between the light source and the atomic cell, and enlarges the radiation angle of light emitted from the light source. A light detector detects light transmitted through the atomic cell.

15 Claims, 10 Drawing Sheets

(56) References Cited

U.S. PATENT DOCUMENTS

2010/0156547 A1* 6/2010 McGuyer ............... G04F 5/145
                                                    331/94.1
2014/0232479 A1* 8/2014 Maki ..................... H01S 1/06
                                                    331/94.1

FOREIGN PATENT DOCUMENTS

| JP | 2009-164331 A | 7/2009 |
| JP | 2009-164334 A | 7/2009 |
| JP | 2013-171881 A | 9/2013 |
| WO | WO-2006-017345 A2 | 2/2006 |

* cited by examiner

QUANTUM INTERFERENCE DEVICE, ATOMIC OSCILLATOR, ELECTRONIC APPARATUS, AND MOVING OBJECT

CROSS-REFERENCE TO RELATED APPLICATIONS

This application claims priority to Japanese Patent Application No. 2016-063268, filed Mar. 28, 2016, the entirety of which is hereby incorporated by reference.

BACKGROUND

1. Technical Field

The present disclosure relates to a quantum interference device, an atomic oscillator, an electronic apparatus, and a vehicle.

2. Related Art

Hitherto, an oscillator which oscillates based on energy transition of atoms of alkali metal, such as rubidium or cesium is known. For example, see Proceedings of the 39th Annual Precise Time and Time Interval Meeting (2007)/The Chip-Scale Atomic Clock—Prototype Evaluation ("Chip-Scale Atomic Clock Prototype Evaluation", hereinafter).

An oscillator described in the Chip-Scale Atomic Clock Prototype Evaluation has a cell which is filled with gaseous alkali metal, a vertical cavity surface emitting laser (VCSEL) which emits light for exciting cesium in the cell, a photodiode which detects light transmitted through the cell, and a spacer which is provided between the VCSEL and the cell. In the oscillator, the VCSEL, the spacer, the cell, and the photodiode are arranged in a line in this order.

In order to increase oscillation characteristics of the oscillator, it is necessary to increase the diameter (i.e., width) of light incident in the cell.

However, for the oscillator described in the Chip-Scale Atomic Clock Prototype Evaluation, since light is incident in the cell in a state of the radiation angle of the VCSEL, and to increase the diameter of light that is incident on the cell, the distance between the VCSEL and the cell should be increased. For this reason, there is a problem in that the oscillator cannot be reduced in size.

SUMMARY

An advantage of some aspects of the present disclosure is that it provides a quantum interference device and an atomic oscillator, which are compact and have excellent oscillation characteristics, and an electronic apparatus and a vehicle with the quantum interference device having excellent reliability.

The advantage can be achieved by the following configurations.

A quantum interference device according to an aspect of the present disclosure includes an atomic cell, a light source, an optical element, and a light detector. The atomic cell is filled with alkali metal atoms, and the light source emits light for exciting the alkali metal atoms in the atomic cell. The light detector (i.e., a light detection unit) detects the light transmitted through the atomic cell. The optical element is disposed between the light source and the atomic cell, and increases a radiation angle of the light emitted from the light source.

According to this quantum interference device, even if the distance between the light source and the atomic cell is made shorter than in the related art, it is possible to make light having a large light diameter incident in the atomic cell, and to increase a region where the alkali metal and light emitted from the light source interact with each other. For this reason, even if the distance between the light source and the atomic cell is short, it is possible to increase the intensity of, for example, an EIT signal detected by the light detection unit, and to improve short term frequency characteristics of the quantum interference device. Therefore, according to the quantum interference device of the aspect of the present disclosure, it is possible to achieve compactness and to exhibit excellent oscillation characteristics.

The quantum interference device according to the aspect of the present disclosure may further include a light blocking member which is provided between the optical element and the atomic cell and shields a part of the light whose radiation angle is enlarged by the optical element.

With this configuration, for example, it is possible to shield an outer circumferential part having low light intensity as a part of light and to make light with less change in energy density incident in the atomic cell. For this reason, for example, it is possible to relax an increase in the line width of an EIT signal or asymmetry of the shape of the EIT signal due to a stark shift. As a result, it is possible to further improve the oscillation characteristics.

The quantum interference device according to the aspect of the present disclosure may further include a quarter-wave plate which is provided between the atomic cell and the optical element.

With this configuration, it is possible to increase, for example, the EIT signal from the light detection unit. As a result, it is possible to further improve the oscillation characteristics. The quarter-wave plate is provided between the atomic cell and the optical element, whereby, even if it is necessary to provide a space between the atomic cell and the optical element, it is possible to effectively use the space.

The quantum interference device according to the aspect of the present disclosure may further include a support which supports the light source, and the light source is provided between the support and the optical element.

With this configuration, the support is used as an alignment member, whereby it is possible to easily set the relative positional relationship between the optical element and the light source in a direction intersecting the arrangement direction of the optical element and the light source. For this reason, it is possible to easily and accurately provide the optical element and the light source with respect to the atomic cell.

The quantum interference device according to the aspect of the present disclosure may further include a support which supports the light source, and the support is provided between the light source and the optical element.

With this configuration, the support is used as a spacer that defines the distance between the optical element and the light source, whereby it is possible to easily set the relative positional relationship between the optical element and the light source in the arrangement direction of the optical element and the light source. For this reason, it is possible to easily and accurately arrange the optical element and the light source with respect to the atomic cell.

In the quantum interference device according to the aspect of the present disclosure, the optical element is a concave lens.

With this configuration, it is possible to enlarge the radiation angle with a simple configuration. For example, in a case where a laser which emits light having high directivity is used as the light source, it is possible to enlarge the radiation angle while maintaining directivity. For this reason, it is possible to increase the intensity of, for example, the EIT signal while reducing the line width of the EIT signal, and thus, to further improve the oscillation characteristics.

In the quantum interference device according to the aspect of the present disclosure, the optical element is a Fresnel lens.

With this configuration, it is possible to enlarge the radiation angle while further reducing the thickness of the optical element. For example, in a case where a laser which emits light having high directivity is used as the light source, it is possible to enlarge the radiation angle while maintaining directivity. For this reason, it is possible to increase the intensity of, for example, the EIT signal while reducing the line width of the EIT signal, and thus, to further improve the oscillation characteristics.

In the quantum interference device according to the aspect of the present disclosure, the optical element is a light diffusion plate.

With this configuration, it is possible to further reduce the thickness of the optical element, and to enlarge the radiation angle to be larger. For this reason, it is possible to bring the optical element closer to the atomic cell, and to further reduce the size of quantum interference device according to the aspect of the present disclosure.

In the quantum interference device according to the aspect of the present disclosure, the distance between a light emitting surface of the light source and the atomic cell is equal to or greater than 0.3 mm and equal to or less than 2.0 mm.

With this configuration, it is possible to prevent an increase in size, and to sufficiently enlarge the radiation angle of light.

In the quantum interference device according to the aspect of the present disclosure, the radiation angle of light whose radiation angle is enlarged by the optical element is equal to or greater than 40°, and a spectral line width of light whose radiation angle is enlarged by the optical element is equal to or less than 100 MHz.

With this configuration, it is possible to sufficiently increase a region where light interacts with the alkali metal atoms, and to reduce the line width of, for example, the EIT signal. For this reason, it is possible to further improve the oscillation characteristics.

An atomic oscillator according to another aspect of the present disclosure includes the quantum interference device according to the aspect of the present disclosure.

With this configuration, it is possible to provide an atomic oscillator which is compact and exhibits excellent oscillation characteristics.

An electronic apparatus according to still another aspect of the present disclosure includes the quantum interference device according to the aspect of the present disclosure.

With this configuration, it is possible to provide an electronic apparatus having high reliability.

A vehicle according to still another aspect of the present disclosure includes the quantum interference device according to the aspect of the present disclosure.

With this configuration, it is possible to provide a vehicle having high reliability.

BRIEF DESCRIPTION OF THE DRAWINGS

The present disclosure will be described with reference to the accompanying drawings, wherein like numbers reference like elements.

DESCRIPTION OF EXEMPLARY EMBODIMENTS

Hereinafter, a quantum interference device, an atomic oscillator, an electronic apparatus, and a vehicle according to an embodiment of the present disclosure will be described in detail based on exemplary embodiments shown in the accompanying drawings.

1. Atomic Oscillator

First, an atomic oscillator, which is provided with a quantum interference device according to an embodiment of the present disclosure, is described. While an example implementation of the quantum interference device of the present disclosure is described with respect to the atomic oscillator, the quantum interference device is not limited, and may be applied to, for example, a magnetic sensor, a quantum memory, or the like, in addition to the atomic oscillator.

First Embodiment

Figure 1:
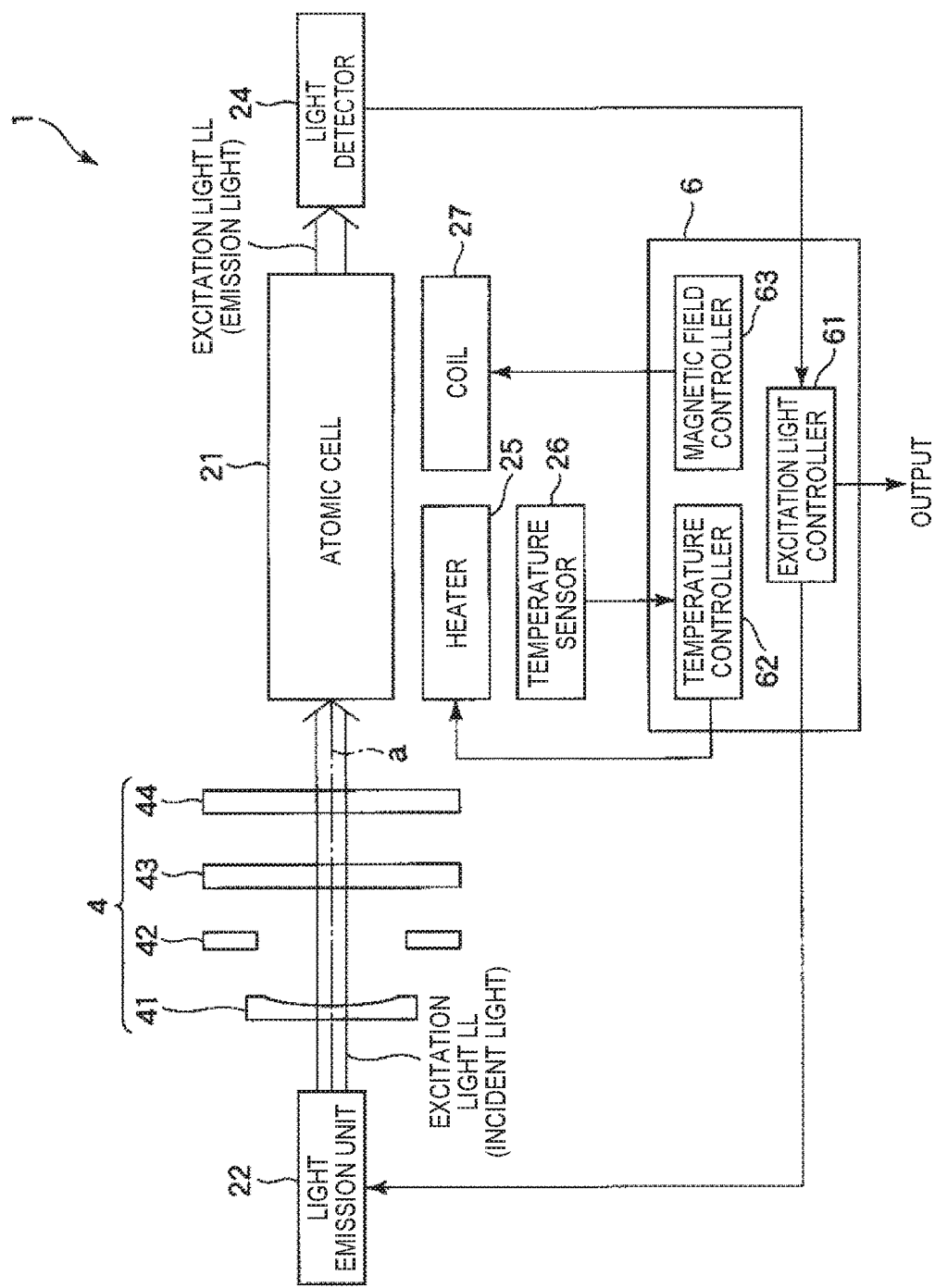
FIG. 1 is a schematic diagram showing an atomic oscillator provided with a quantum interference device according to a first embodiment of the present disclosure.
Figure 2:
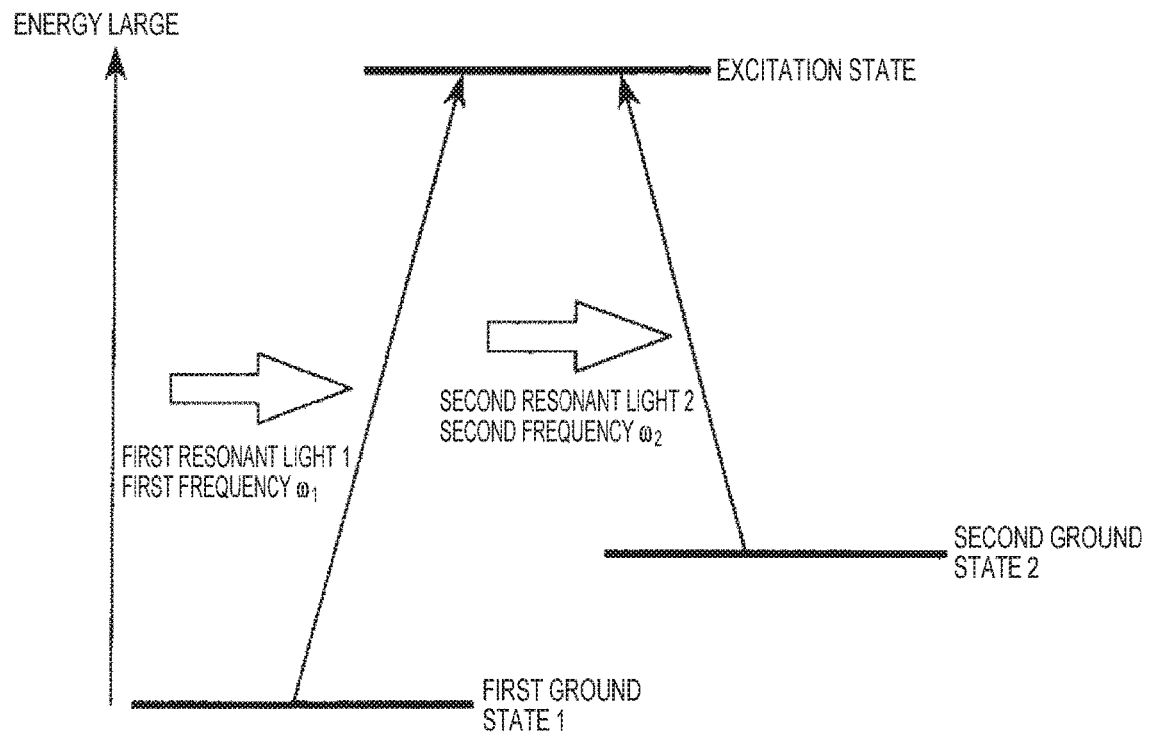
FIG. 2 is a diagram illustrating an energy state of alkali metal.
Figure 3:
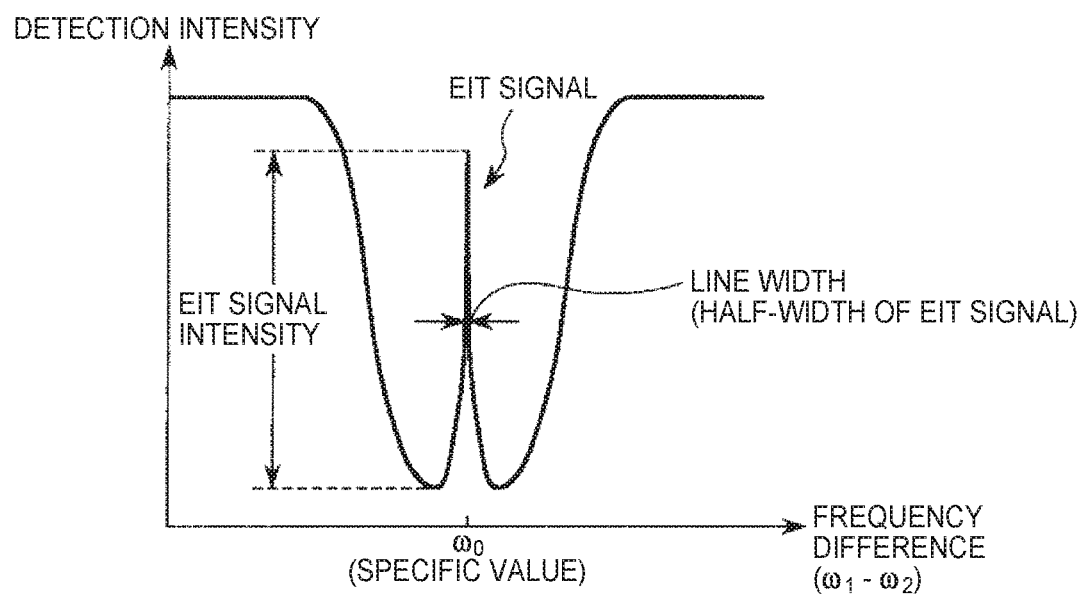
FIG. 3 is a graph showing the relationship of a frequency difference between two light beams from a light emission unit and detection intensity from a light detection unit.

FIG. 1 is a schematic diagram of an atomic oscillator provided with a quantum interference device according to a first embodiment of the present disclosure. FIG. 2 is a diagram illustrating an energy state of alkali metal. FIG. 3 is a graph showing the relationship of a frequency difference between two light beams from a light emission unit and detection intensity from a light detection unit.

An atomic oscillator 1 shown in FIG. 1 is an atomic oscillator using coherent population trapping.

As shown in FIG. 1, the atomic oscillator 1 is provided with an atomic cell 21, a light emission unit 22, an optical system 4, a light detection unit 24, a heater 25, a temperature sensor 26, a coil 27, and a controller (a control unit) 6 which controls the respective units of the atomic oscillator 1.

First, the principle of the atomic oscillator 1 will be simply described.

As shown in FIG. 1, in the atomic oscillator 1, the light emission unit 22 emits excitation light LL toward the atomic cell 21, and the light detection unit 24 detects the excitation light LL transmitted through the atomic cell 21.

The atomic cell 21 is filled with gaseous alkali metal (metal atoms), and as shown in FIG. 2, the alkali metal has energy levels of a three-level system, and may show three states of two ground states (first and second ground states) having different energy levels and an excitation state. The first ground state is an energy state lower than the second ground state.

The excitation light LL emitted from the light emission unit 22 includes two types of resonant light (first resonant light and second resonant light) having different frequencies, and when the gaseous alkali metal is irradiated with the two types of resonant light, light absorptance (light transmittance) of the first and second resonant lights in the alkali metal changes according to the difference between a frequency $\omega_1$ of the first resonant light and a frequency $\omega_2$ of the second resonant light (i.e., $\omega_1-\omega_2$).

Then, when the difference ($\omega_1-\omega_2$) between the frequency $\omega_1$ of the first resonant light and the frequency $\omega_2$ of the second resonant light matches a frequency corresponding to the energy difference between the first ground state and the second ground state, excitations from the ground states 1 and 2 to the excitation state are respectively stopped. At this time, the first and second resonant lights pass through the alkali metal without being absorbed therein. Such a phenomenon is referred to as a coherent population trapping (CPT) phenomenon or an electromagnetically induced transparency (EIT) phenomenon.

For example, if the light emission unit 22 fixes the frequency $\omega_1$ of the first resonant light and changes the frequency $\omega_2$ of the second resonant light, when the difference ($\omega_2-\omega_2$) between the frequency $\omega_1$ of the first resonant light and the frequency $\omega_2$ of the second resonant light matches or, in other words, equals a frequency $\omega_0$ corresponding to the energy difference between the first ground state and the second ground state, as shown in FIG. 3, the detection intensity of the light detection unit 24 rapidly increases with the above-described EIT phenomenon. Such a rapid signal is detected as an EIT signal. The EIT signal has a specific value determined by the type of the alkali metal. Accordingly, it is possible to configure an oscillator using such an EIT signal.

Hereinafter, the configuration of each unit of the atomic oscillator 1 of this embodiment will be described.

Figure 4:
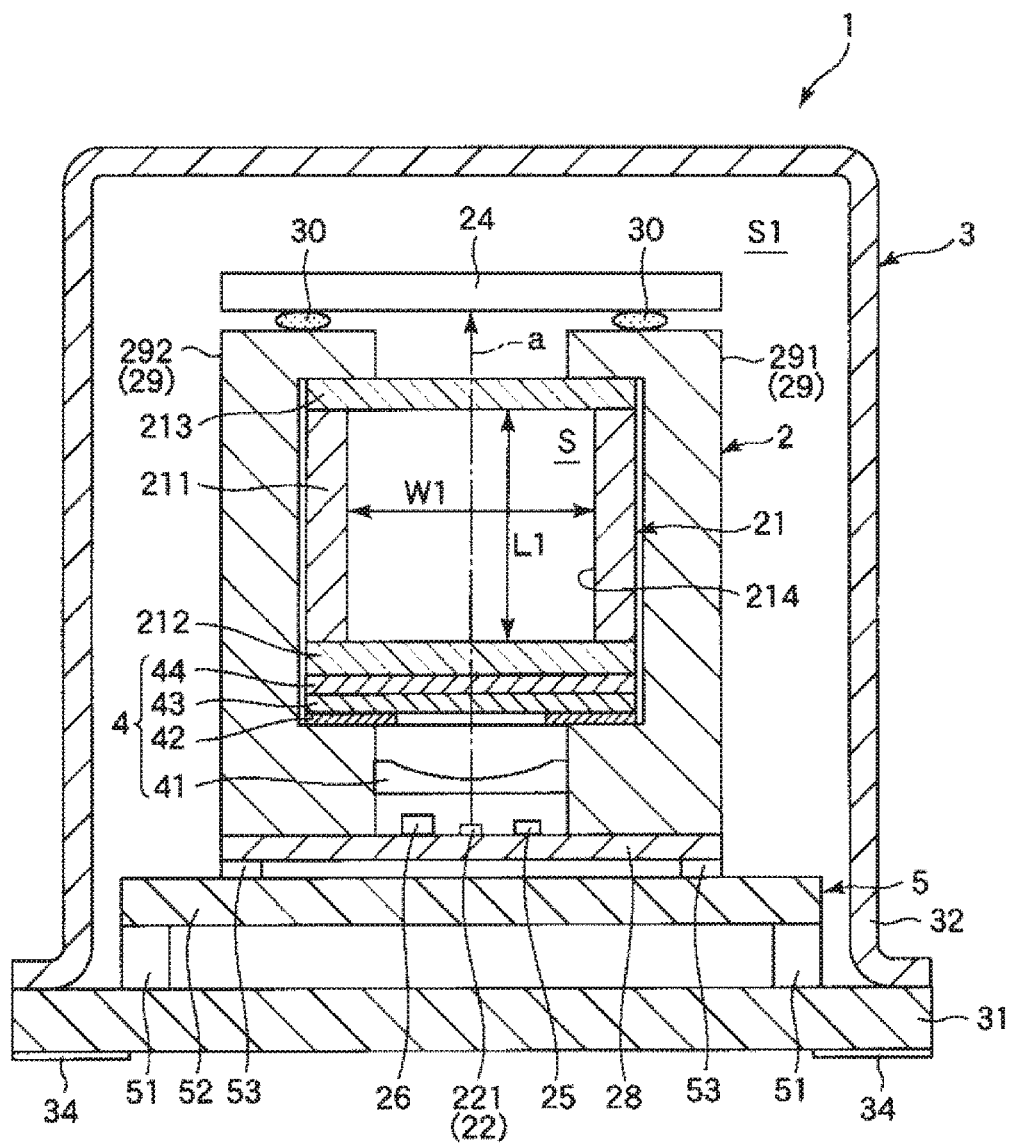
FIG. 4 is a schematic of a sectional view of the atomic oscillator.

FIG. 4 is a sectional view showing the schematic configuration of the atomic oscillator shown in FIG. 1. Hereinafter, for convenience of description, the top side of FIG. 4 is referred to as "top" and the bottom side is referred to as "bottom".

As shown in FIG. 4, the atomic oscillator 1 is provided with an atomic cell unit 2 which causes coherent population trapping described above, a package 3 which houses the atomic cell unit 2, and a support member 5 which is housed in the package 3 and supports the atomic cell unit 2 with respect to the package 3. Though not shown, the coil 27 is provided to surround the atomic cell unit 2 inside the package 3 or outside the package 3. A magnetic shield may be provided outside the package 3 as necessary.

Hereinafter, the respective units of the atomic oscillator 1 will be described.

Atomic Cell Unit

The atomic cell unit 2 includes the atomic cell 21, the light emission unit 22 having a light source 221, the optical system 4, the light detection unit 24, the heater 25, the temperature sensor 26, a substrate 28 as a support, and a connection member 29, and these are formed into a unit. Specifically, the light emission unit 22, the heater 25, the temperature sensor 26, and the connection member 29 are mounted on the top surface of the substrate 28; the atomic cell 21 and the optical system 4 are retained by the connection member 29; and the light detection unit 24 is bonded to the connection member 29 via an adhesive 30.

Atomic Cell

The atomic cell 21 is filled with alkali metal, such as gaseous rubidium, cesium, or sodium. The atomic cell 21 may be filled with noble gas, such as argon or neon, and inert gas, such as nitrogen, along with alkali metal gas as buffer gas as necessary.

As shown in FIG. 4, the atomic cell 21 has a body portion 211 having a columnar through hole 214, and a pair of light transmissive portions 212 and 213 which seal the openings on both sides of the through hole 214. With this, an internal space S which is filled with the alkali metal described above is formed.

In this embodiment, the through hole 214 has a columnar shape. For this reason, a cross-section of the through hole 214 in a direction perpendicular to an optical axis (a), or in other words, a cross-section of the internal space S has a circular shape. The cross-section shape of the through hole 214 is not limited to the circular shape, and may be an elliptical shape, or a polygonal shape, such as a quadrangular shape.

When the length of the internal space S in a direction along the optical axis (a) is represented as L1 and the width of the cross-section of the internal space S is represented as W1, L1/W1 can be made to be, for example, equal to or greater than 1 and equal to or less than 2. The length L1 can be made to be, for example, equal to or greater than 2 mm and equal to or less than 7 mm. The width W1 can be made to be, for example, equal to or greater than 2 mm and equal to or less than 4.5 mm.

Each of the light transmissive portions 212 and 213 of the atomic cell 21 has transmissivity and therefore transmit the excitation light LL (resonant light) from the light emission unit 22. One light transmissive portion 212 is an "incidence-side light transmissive portion" which transmits the excitation light LL incident in the atomic cell 21, and the other light transmissive portion 213 is an "emission-side light transmission portion" which transmits the excitation light LL emitted from the atomic cell 21.

A material forming the light transmissive portions 212 and 213 is not particularly limited as long as the material has transmissivity as described. For example, a glass material, quartz, or the like may be used.

A material forming the body portion 211 of the atomic cell 21 is not particularly limited, and may be a silicon material, a ceramics material, a metal material, a resin material, or the like, or may be a glass material, quartz, or the like like the light transmissive portions 212 and 213.

Each of the light transmissive portions 212 and 213 is bonded to the body portion 211 hermetically. With this, the internal space S of the atomic cell 21 can be formed as an airtight space.

A method of bonding the body portion 211 of the atomic cell 21 and the light transmissive portions 212 and 213 is determined according to the materials forming these portions and is not particularly limited, and for example, a bonding method using an adhesive, a direct bonding method, an anode bonding method, or the like can be used.

Light Emission Unit

The light emission unit 22 has the light source 221 which emits the excitation light LL for exciting the alkali metal atoms in the atomic cell 21. The light source 221 is supported by the substrate 28 such that a light emitting surface 222 from which the excitation light LL is emitted turns toward the atomic cell 21 side.

The light source 221 emits two types of light (first resonant light and second resonant light) having different frequencies as the excitation light LL. The frequency $\omega_1$ of the first resonant light can excite (resonate) the alkali metal in the atomic cell 21 from the above-described first ground state to the excitation state. The frequency $\omega_2$ of the second resonant light can excite (resonate) the alkali metal in the atomic cell 21 from the above-described second ground state to the excitation state.

The light source 221 is not particularly limited as long as the light source 221 can emit the above-described excitation light LL, and for example, a light emitting element including a semiconductor laser, such as a vertical cavity surface emitting laser (VCSEL), is preferably used. Specifically, a semiconductor laser having a spectral line width equal to or less than 100 MHz is preferably used. With the use of a laser which emits light having high directivity, it is possible to reduce the line width of the EIT signal output from the light detection unit 24. As a result, it is possible to improve the oscillation characteristics of the atomic oscillator 1.

Optical System

The optical system 4 is provided between the light source 221 and the atomic cell 21, and has an optical element 41, a light blocking member 42, and optical components 43 and 44. In this embodiment, the optical element 41, the light blocking member 42, the optical component 43, and the optical component 44 are arranged in this order from the light source 221 side toward the atomic cell 21 side. The details of the optical system 4 will be described below.

Light Detection Unit

The light detection unit 24 detects the intensity of the excitation light LL (first and second resonant lights) transmitted through the atomic cell 21.

The light detection unit 24 is not particularly limited as long as the light detection unit 24 can detect the excitation light LL described above. For example, a photodetector (light receiving element), such as a solar cell or a photodiode, can be used.

Heater

The heater 25 has a heating resistor (heating portion) which generates heat with electrical conduction. The heater 25 is a "temperature regulator unit" or "temperature regulator element" which regulates the temperature of the atomic cell 21. With this, it is possible to maintain the atomic cell unit 2 at a desired temperature and to make the characteristics of the atomic oscillator 1 excellent.

In this embodiment, as described above, the heater 25 is provided on the substrate 28. Then, heat from the heater 25 is transmitted to the atomic cell 21 through the substrate 28 and the connection member 29. With this, the atomic cell 21 (specifically, the alkali metal in the atomic cell 21) is heated, and the alkali metal in the atomic cell 21 can be maintained in a state of gas having a desired concentration. In this embodiment, heat from the heater 25 is also transmitted to the light source 221 through the substrate 28.

The heater 25 is separated from the atomic cell 21. With this, it is possible to prevent an unnecessary magnetic field, which is generated with electrical conduction to the heater 25, from affecting the metal atoms in the atomic cell 21.

Temperature Sensor

The temperature sensor 26 detects the temperature of the heater 25 or the atomic cell 21. Then, the amount of heat generated from the above-described heater 25 is suppressed based on the detection result of the temperature sensor 26. With this, it is possible to maintain the alkali metal atoms in the atomic cell 21 at a desired temperature.

In this embodiment, the temperature sensor 26 is provided on the substrate 28. Accordingly, the temperature sensor 26 detects the temperature of the heater 25 through the substrate 28. Alternatively, the temperature sensor 26 detects the temperature of the atomic cell 21 through the substrate 28 and the connection member 29.

The position where the temperature sensor 26 is provided is not limited thereto, and may be, for example, on the connection member 29, on the heater 25, or on the outer surface of the atomic cell 21.

The temperature sensor 26 is not particularly limited, and various known temperature sensors, such as a thermistor and a thermocouple, can be used.

Connection Member

The connection member 29 thermally connects the heater 25 and the respective light transmissive portions 212 and 213 of the atomic cell 21. With this, heat from the heater 25 can be transmitted to the light transmissive portions 212 and 213 with thermal conduction through the connection member 29, and the respective light transmissive portions 212 and 213 can be heated. The heater 25 can be separated from the atomic cell 21. For this reason, it is possible to prevent an unnecessary magnetic field, which is generated with electrical conduction to the heater 25, from affecting the alkali metal atoms in the atomic cell 21. Furthermore, since it is possible to reduce the number of heaters 25, for example, it is possible to reduce the number of wirings for electrical conduction to the heater 25, and as a result, to achieve reduction in size of the atomic oscillator 1.

As shown in FIG. 4, the connection member 29 is formed with a pair of connection members 291 and 292 provided to sandwich the atomic cell 21 therebetween. With this, it is possible to facilitate the installation of the connection member 29 with respect to the atomic cell 21, and to transmit heat from the connection member 29 to the respective light transmissive portions 212 and 213 of the atomic cell 21 uniformly.

A pair of connection members 291 and 292 is fitted to sandwich the atomic cell 21, for example, from both sides of a pair of side surfaces of the atomic cell 21 facing each other. Then, the light transmissive portions 212 and 213 and the connection members 291 and 292 are in contact with each other and are thermally connected to each other. The connection members 291 and 292 are respectively formed to avoid a region through which the excitation light LL passes.

As a material forming the connection member 29, a material having excellent thermal conductivity, for example, a metal material is preferably used. Like the package 3 described below, as the material forming the connection member 29, a nonmagnetic material is preferably used so as not to obstruct the magnetic field from the coil 27.

Substrate

The substrate 28 supports the light emission unit 22, the heater 25, the temperature sensor 26, the connection member 29, and the like described above. The substrate 28 also transmits heat from the heater 25 to the connection member 29. With this, even if the heater 25 is separated from the connection member 29, it is possible to transmit heat from the heater 25 to the connection member 29.

The substrate 28 thermally connects the heater 25 and the connection member 29. In this way, the heater 25 and the connection member 29 are mounted on the substrate 28, whereby it is possible to increase the degree of freedom for the installation of the heater 25.

The light source 221 is mounted on the substrate 28, whereby it is possible to regulate the temperature of the light source 221 on the substrate 28 with heat from the heater 25.

The substrate 28 has wirings (not shown) which are electrically connected to the light source 221, the heater 25, and the temperature sensor 26.

A material for forming the substrate 28 is not particularly limited, and may include, for example, a ceramic material, a metal material, or the like. One type of material may be used alone or two or more types of material may be used in combination. In a case were the surface of the substrate 28 is formed of a metal material, it is possible to increase heat reflectance on the surface of the substrate 28, and to suppress heat radiation from the substrate 28. In a case where the substrate 28 is formed of a metal material, an insulating layer formed of, for example, a resin material, metal oxide, metal nitride, or the like may be provided on the surface of the substrate 28 as necessary for the purpose of preventing short-circuiting of the wirings in the substrate 28.

Like the package 3 described below, as the material forming the substrate 28, a nonmagnetic material is preferably used so as not to obstruct the magnetic field from the coil 27.

The substrate 28 can be omitted depending on the shape of the connection member 29, the installation position of the heater 25, or the like. In this case, the heater 25 may be provided at a position in contact with the connection member 29.

Package

As shown in FIG. 4, the package 3 houses the atomic cell unit 2 and the support member 5. In the package 3, components other than the above-described components may be housed.

As shown in FIG. 4, the package 3 is provided with a plate-shaped base 31 (base portion) and a cylindrical lid 32 (lid portion) with a closed bottom, and the opening of the lid 32 is sealed with the base 31. With this, an internal space S1 which houses the atomic cell unit 2 and the support member 5 is formed. The lid 32 is separated from the atomic cell unit 2 and the support member 5. That is, a space is provided between the lid 32, and the atomic cell unit 2 and the support member 5. With this, this space functions as a heat insulating layer, thereby reducing heat interference between the atomic cell unit 2 and the outside of the package 3.

The base 31 supports the atomic cell unit 2 through the support member 5.

The base 31 is, for example, a wiring board, and a plurality of terminals 34 are provided on the bottom surface of the base 31. A plurality of terminals 34 are respectively electrically connected to the light source 221, the substrate 28, and the like described above through wirings (not shown).

A material forming the base 31 is not particularly limited, and for example, a resin material, a ceramic material, or the like can be used. Of these, a ceramic material is preferably used. With this, it is possible to make airtightness of the internal space S1 excellent while realizing the base 31 forming a wiring board.

The lid 32 is bonded to the base 31. A method of bonding the base 31 and the lid 32 is not particularly limited, and may include, for example, soldering, seam welding, energy beam welding (laser welding, electron beam welding, or the like), or the like. A bonding member for bonding the base 31 and the lid 32 may be interposed between the base 31 and the lid 32.

It is preferable that the base 31 and the lid 32 are bonded to each other hermetically. That is, it is preferable that the inside of the package 3 is an airtight space. With this, it is possible to bring the inside of the package 3 into a decompressed state, and as a result, to improve the characteristics of the atomic oscillator 1.

In particular, it is preferable that the inside of the package 3 is in the decompressed state (vacuum). With this, it is possible to suppress transmission of heat through the space inside the package 3. For this reason, it is possible to suppress heat interference between the connection member 29 and the outside of the package 3. It is also possible to more effectively suppress heat transmission between the atomic cell unit 2 and the outside of the package 3. It is also possible to reduce power consumption of the heater 25 when maintaining the temperature of the atomic cell 21 at a predetermined temperature using the above-described heater 25.

A material forming the lid 32 is not particularly limited, and for example, a resin material, a ceramic material, a metal material, or the like can be used. Of these, a metal material, such as Kobar, 42 alloy, or stainless steel, is preferably used. With this, it is possible to make airtightness of the internal space S1 excellent while realizing the lid 32 having a magnetic shielding property. In a case where the coil 27 is provided outside the package 3, as the material forming the lid 32, a nonmagnetic material, such as SUS 304, can be used. With this, since it is possible to reduce the volume of the internal space S1, it is possible to make airtightness of the internal space S1 excellent or to reduce power consumption of the heater 25.

Support Member

The support member 5 is housed inside the package 3, and supports the atomic cell unit 2 with respect to the package 3 (specifically, the base 31 constituting a part of the package 3).

The support member 5 suppresses transmission of heat between the atomic cell unit 2 and the outside of the package 3. With this, it is possible to suppress heat interface between the respective units of the atomic cell unit 2 and the outside.

As shown in FIG. 4, the support member 5 has a plurality of leg portions 51 which stand on the top surface side of the base 31. A plate-shaped connection portion 52 is connected to top end portions of a plurality of leg portions 51 and has a plurality of holes passing therethrough in a thickness direction. A plurality of columnar portions 53 stand on the top surface side of the connection port 52 and are connected to the substrate 28.

In the support member 5 configured as above, heat from the atomic cell unit 2 is transmitted to the base 31 through the columnar portions 53, the connection portion 52, and the leg portions 51 in this order. With this, it is possible to extend a transmission path of heat from the atomic cell unit 2 to the base 31 through the support member 5. For this reason, it is possible to further reduce transmission of heat between the atomic cell unit 2 and the outside of the package 3.

A material forming the support member 5 is not particularly limited as long as the material has comparatively low thermal conductivity and can secure rigidity of the support member 5 to support the atomic cell unit 2. For example, nonmetal, such as a resin material or a ceramic material, is preferably used, and a resin material is more preferably used. In a case where the support member 5 is primarily formed of a resin material, it is possible to increase heat resistance of the support member 5, and to easily manufacture the support member 5 using, for example, known methods, such as injection molding, even if the shape of the support member 5 is complicated. In particular, in a case where the support member 5 is primarily formed of a resin material, it is possible to easily form the support member 5 formed of a foam having large heat resistance.

As the material forming the support member 5, a nonmagnetic material is preferably used so as not to obstruct the magnetic field from the coil 27.

According to the support member 5, since the support member 5 is provided between the atomic cell unit 2 and the base 31, it is possible to reduce heat transmission between the atomic cell unit 2 and the outside, and to perform temperature control of the atomic cell 21, the light source 221, or the like with high accuracy.

Coil

The coil 27 shown in FIG. 1 applies a magnetic field to the alkali metal in the atomic cell 21. With this, the degenerated gap between a plurality of different energy levels of the alkali metal atoms in the atomic cell 21 can be expanded by Zeeman splitting, thereby improving resolution. As a result, it is possible to increase the accuracy of the oscillation frequency of the atomic oscillator 1.

In this embodiment, the coil 27 is formed as a solenoid type with a coil wound around the outer circumference of the atomic cell 21. The coil 27 may be formed as a Helmholtz type with a pair of coils provided to face each other through the atomic cell 21.

The magnetic field generated by the coil 27 may be any one magnetic field of a DC magnetic field and an AC magnetic field, or may be a magnetic field in which a DC magnetic field and an AC magnetic field are superimposed on each other.

Controller (Control Unit)

The controller 6 (control unit 6) shown in FIG. 1 controls the heater 25, the coil 27, and the light emission unit 22.

The control unit 6 has an excitation light controller 61 (light control unit 61) which controls the frequencies of the first and second resonant lights of the light source 221, a temperature controller 62 (a temperature control unit 62) which controls the temperature of the alkali metal in the atomic cell 21, and a magnetic field controller (a magnetic field control unit 63) which controls a magnetic field applied to the atomic cell 21.

The excitation light control unit 61 controls the frequencies of the first and second resonant lights emitted from the light source 221 based on the detection result of the above-described light detection unit 24. Specifically, the excitation light control unit 61 controls the frequencies of the first and second resonant lights emitted from the light source 221 such that the frequency difference ($\omega_1-\omega_2$) becomes the frequency $\omega_0$ specific to the above-described alkali metal. The excitation light control unit 61 controls the center frequencies of the first and second resonant lights emitted from the light emission unit 22.

The excitation light control unit 61 is provided with a voltage controlled crystal oscillator (oscillation circuit) (not shown), and outputs an output signal of the voltage controlled crystal oscillator as an output signal of the atomic oscillator 1 while synchronizing and regulating the oscillation frequency of the voltage controlled crystal oscillator based on the detection result of the light detection unit 24.

For example, the excitation light control unit 61 is provided with a multiplier (not shown) which performs frequency multiplication on an output signal from the voltage controlled crystal oscillator, and inputs a signal (high frequency signal) multiplied by the multiplier to the light source 221 as a drive signal in a state of being superimposed on a DC bias current. With this, the voltage controlled crystal oscillator is controlled such that the EIT signal is detected by the light detection unit 24, whereby a signal having a desired frequency is output from the voltage controlled crystal oscillator. A multiplication rate of the multiplier is, for example, $\omega_0/(2\times f)$ when the desired frequency of the output signal from the atomic oscillator 1 is f. With this, when the oscillation frequency of the voltage controlled crystal oscillator is f, it is possible to modulate the light source 221 formed with a light emitting elements, such as a semiconductor laser, using the signal from the multiplier to emit two types of light in which the frequency difference ($\omega_1-\omega_2$) becomes $\omega_0$.

The temperature control unit 62 controls electrical conduction to the heater 25 based on the detection result of the temperature sensor 26. With this, it is possible to maintain the atomic cell 21 within a desired temperature range.

The magnetic field control unit 63 controls electrical conduction to the coil 27 such that the magnetic field generated by the coil 27 becomes uniform.

The control unit 6 is provided in, for example, an IC chip mounted on the substrate on which the package 3 is mounted. It should be noted that the control unit 6 may be provided inside the package 3 (for example, on the base 31).

The outline of the atomic oscillator 1 has been described above.

Next, the optical system 4 will be described in detail referring to FIGS. 5 and 6.

Figure 5:
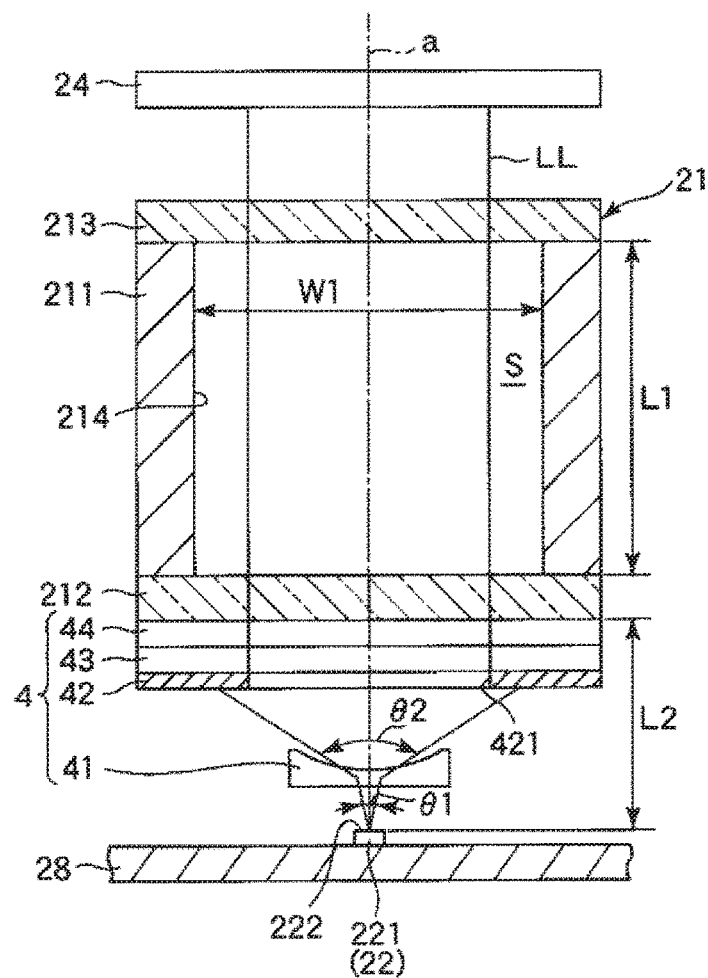
FIG. 5 is a schematic showing a light source, an optical system, an atomic cell, and a light detection unit shown in FIG. 4.

FIG. 5 is a schematic view showing the light source, the optical system, the atomic cell, and the light detection unit shown in FIG. 4. FIG. 6 is a graph showing an intensity distribution of light enlarged by the optical element of FIG. 5. Hereinafter, for convenience of description, the top side of FIG. 5 is referred to as "top" and the bottom side is referred to as "bottom".

Optical System

As shown in FIG. 5, the optical system 4 is provided on the optical path of the excitation light LL between the light source 221 and the atomic cell 21. As described above, the optical system. 4 has the optical element 41, the light blocking member 42, and the optical components 43 and 44.

Optical Element

The optical element 41 shown in FIG. 5 is a concave lens.

The excitation light LL emitted from the light source 221 is emitted in a state of being enlarged at a predetermined radiation angle θ1. The optical element 41 is provided to enlarge (i.e., increase) the radiation angle θ1 of the excitation light LL. That is, the optical element 41 enlarges the radiation angle θ1 of the excitation light LL emitted from the light source 221 to a radiation angle θ2 that is greater than the radiation angle θ1. With this, it is possible to increase the light diameter of the excitation light LL incident in the atomic cell 21. For this reason, it is possible to increase a region where the alkali metal and the excitation light LL interact with each other in the atomic cell 21, and to increase the intensity of the EIT signal detected by the light detection unit 24. As a result, it is possible to improve short term frequency characteristics and to improve the oscillation characteristics. The term "radiation angle" indicates a spread angle of the excitation light LL with the optical axis (a) of the diameter of the excitation light LL as a center axis. The term "diameter of excitation light LL" indicates a diameter (width) at a position where light intensity is $1/e^2$ of a peak value in the cross-sectional intensity distribution of the excitation light LL.

In this embodiment, since a concave lens is used as the optical element 41, it is possible to enlarge the radiation angle θ1 to the radiation angle θ2 larger than the radiation angle θ1 with a simple configuration. With the use of the concave lens, in a case where, for example, a laser, such as a semiconductor laser, which emits light having high directivity is used as the light source 221, it is possible to enlarge the radiation angle θ1 while maintaining directivity. For this reason, it is possible to increase the intensity of the EIT signal while reducing the line width of the EIT signal. As a result, it is possible to improve the short term frequency characteristics and to further improve the oscillation characteristics. In this embodiment, although lens power of the optical element 41 is equal in the x-axis direction and the y-axis direction, lens power may be different in the x-axis direction and the y-axis direction.

In particular, in this embodiment, it is preferable that an aspheric concave lens is used as the optical element 41. With this, it is possible to reduce spherical aberration, and as a result, to further reduce the line width of the EIT signal.

In the optical element 41, θ2/θ1 is preferably equal to or greater than 2, more preferably, equal to or greater than 3 and equal to or less than 9, and still more preferably, equal to or greater than 4.5 and equal to or less than 6.0. With this, it is possible to make the excitation light LL having a sufficiently large light diameter incident in the atomic cell 21 with a comparatively simple configuration.

Specifically, the radiation angle θ2 is preferably equal to or greater than 40°, more preferably, equal to or greater than 60° and equal to or less than 180°, and still more preferably, equal to or greater than 90° and equal to or less than 120°. With this, it is possible to make the excitation light LL having a sufficiently large light diameter incident in the atomic cell 21 with a comparatively small configuration. From the same viewpoint, the beam diameter of the excitation light LL on the outer surface of the light transmissive portion 212 as the incidence surface of the atomic cell 21 is preferably smaller than the width W1, and the beam diameter of the excitation light LL on the outer surface of the light transmissive portion 213 as the emission surface of the atomic cell 21 is preferably greater than the width W1. In addition, the beam diameter of the excitation light LL on the outer surface of the light transmissive portion 212 as the incidence surface of the atomic cell 21 is more preferably greater than the width W1, and the beam diameter of the excitation light LL on the outer surface of the light transmissive portion 213 as the emission surface of the atomic cell 21 is more preferably greater than the width W1. The term "beam diameter of excitation light LL" means a beam diameter of the excitation light LL enlarged to the radiation angle θ2 through the optical element 41 in a case where the light blocking member 42 described below is not provided. The radiation angle θ1 also depends on the configuration of the light source 221, or the like, and for example, in a case where the VCSEL is used, the radiation angle θ1 is about 20°.

A material forming the optical element 41 is not particularly limited as long as the material transmits the excitation light LL. For example, a resin material, a glass material, or the like can be used. In this embodiment, although the concave surface of the concave lens turns toward the atomic cell 21 side, the concave surface may turn toward the light source 221 side. A biconcave lens having both concave surfaces or the like may be used.

The thickness of the optical element 41 is not particularly limited, and is, for example, equal to or greater than 0.5 mm and equal to or less than 2 mm. If the thickness in this range is set, it is possible to sufficiently enlarge the radiation angle θ1 of the excitation light LL while preventing a distance L2 between the light source 221 and the atomic cell 21 from excessively increasing.

Light Blocking Member

The light blocking member 42 is a film-like member having a light blocking property, and is provided on the surface of the optical component 43 on the optical element 41 side.

The light blocking member 42 has an opening 421 which transmits a part of the excitation light LL, and a portion excluding the opening 421 has a light blocking property. The opening 421 has a circular shape when viewed from the light source 221 side, and the light blocking member 42 is provided such that a center portion of the excitation light LL passes through the opening 421. With this, the center portion which is a part of the excitation light LL enlarged by the optical element 41 passes through the opening 421, and an outer circumferential portion which is the remaining portion of the excitation light LL is blocked by the light blocking member 42. In this way, the light diameter of the excitation light LL is regulated by the light blocking member 42.

Figure 6:
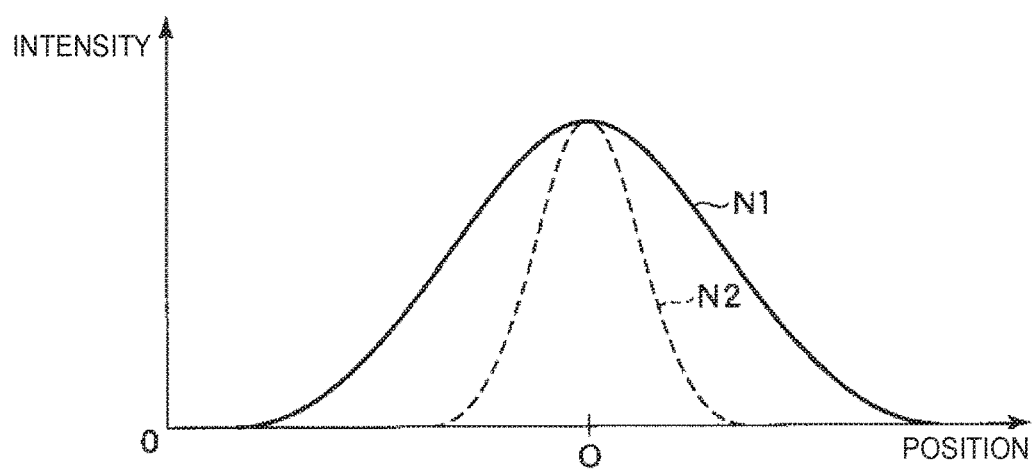
FIG. 6 is a graph showing a cross-section intensity distribution of light enlarged by an optical element.

As shown in FIG. 6, in this embodiment, the cross-section intensity distribution of the excitation light LL forms a Gaussian distribution. In FIG. 6, a distribution N2 indicated by a broken line indicates the cross-sectional intensity distribution of the excitation light LL emitted from the light source 221, and a distribution N1 indicated by a solid line indicates the cross-section intensity distribution of the excitation light LL enlarged by the optical element 41. In FIG. 6, the horizontal axis indicates the diameter (width) of the excitation light LL with 0 (zero) as the optical axis (a), and the vertical axis indicates light intensity normalized with peak intensity (peak) as 1.

As will be understood from FIG. 6, according to the above-described optical element 41, the excitation light LL is enlarged and the light diameter of the excitation light LL is increased. The center portion of the excitation light LL undergoes less change in energy density than the outer circumferential portion of the excitation light LL. Then, as will be understood from the distribution N2, the light diameter of the excitation light LL is enlarged by the optical element 41, whereby it is possible to further reduce change in energy density of the center portion of the excitation light LL. Accordingly, with the optical element 41 which enlarges the excitation light LL, and the light blocking member 42 which is provided between the optical element 41 and the atomic cell 21 and blocks the outer circumferential portion having low light intensity as a part of the excitation light LL enlarged by the optical element 41, it is possible to make the excitation light LL with less change in energy density incident in the atomic cell 21. For this reason, it is possible to relax an increase in the line width of the EIT signal or asymmetry of the shape of the EIT signal due to a stark shift.

A material forming the light blocking member 42 is not particularly limited as long as the portion excluding the opening 421 has a light blocking property, and may include, for example, a resin material, a metal material, or the like.

The light blocking member 42 can be formed on the optical component 43 using a known film deposition method.

It is preferable that the light blocking member 42 absorb the excitation light LL. With this, it is possible to reduce an adverse effect of the excitation light LL not incident in the atomic cell 21 on the EIT signal to be detected. In providing the light blocking member 42 which absorbs the excitation light LL, the light blocking member 42 may be formed in, for example, black or a dark color.

The diameter (width) of the opening 421 of the light blocking member 42 is smaller than the width W1 of the inner wall surface of the atomic cell 21. With this, it is possible to prevent or reduce exposure of the body portion 211 to the excitation light LL in the atomic cell 21. As a result, it is possible to reduce the line width of the EIT signal.

Optical Component

The optical component 43 is a neutral density filter (ND filter). With this, it is possible to regulate (decrease) the intensity of the excitation light LL incident in the atomic cell 21. For this reason, even in a case where the output of the light source 221 is large, it is possible to make the excitation light LL incident in the atomic cell 21 have a desired light amount.

The optical component 44 is a quarter-wave plate. With this, it is possible to convert the excitation light LL from the light source 221 from linearly polarized light to circularly polarized light (right-handed circularly polarized light or left-handed circularly polarized light). With the use of the excitation light LL which is circularly polarized light, it is possible to increase the number of atoms exhibiting a desired EIT phenomenon and to increase the intensity of a desired EIT signal. As a result, it is possible to improve the oscillation characteristics of the atomic oscillator 1.

In a case of providing an optical component, such as the optical component 44 which is a quarter-wave plate and the optical component 44 which is a neutral density filter, as in this embodiment, it is preferable that the optical component is provided between the atomic cell 21 and the optical element 41. With this, the optical component 44 which is a quarter-wave plate is provided between the atomic cell 21 and the optical element 41, whereby, even if it is necessary to provide a space between the atomic cell 21 and the optical element 41, it is possible to effectively use the space.

The optical system 4 may have other optical components, such as a lens and a polarizing plate, in addition to the optical element 41, the light blocking member 42, and the optical components 43 and 44. The optical component 43 can be omitted according to the intensity of the excitation light from the light source 221.

As described above, the atomic oscillator 1, which is a kind of quantum interference device of the present disclosure described above, has the atomic cell 21 which is filled with the alkali metal atoms, the light source 221 which emits the excitation light LL exciting the alkali metal atoms in the atomic cell 21, the light detection unit 24 which detects the excitation light LL transmitted through the atomic cell 21, and the optical element 41. The optical element 41 is provided between the light source 221 and the atomic cell 21, and increases the radiation angle θ1 of the excitation light LL emitted from the light source 221. According to the atomic oscillator 1, since the excitation light LL having the radiation angle θ1 can be enlarged to the radiation angle θ2 greater than the radiation angle θ1 by the optical element 41, even if the distance between the light source 221 and the atomic cell 21 is made shorter than in the related art, it is possible to make the excitation light LL having a large light diameter incident in the atomic cell 21. For this reason, it is possible to increase the region where the alkali metal and the excitation light LL interact with each other, and to increase the intensity of the EIT signal detected by the light detection unit 24. As a result, even if the distance between the light source 221 and the atomic cell 21 is made shorter than in the related art, it is possible to improve the short term frequency characteristics. Therefore, according to the atomic oscillator 1, it is possible to achieve compactness and to exhibit excellent oscillation characteristics.

In order to remarkably exhibit such an effect, when the distance between the light emitting surface 222 of the light source 221 and the atomic cell 21 is L2, L2/L1 is preferably equal to or greater than 0.03 and equal to or less than 2.0, and more preferably, equal to or greater than 0.03 and equal to or less than 1.0. Specifically, the distance L2 is preferably equal to or greater than 0.3 mm and equal to or less than 2.0 mm, more preferably, equal to or greater than 0.3 mm and equal to or less than 1.8 mm, and still more preferably, equal to or greater than 0.3 mm and equal to or less than 1.6 mm. With this, it is possible to sufficiently enlarge the radiation angle θ1 of the excitation light LL while preventing an increase in size of the atomic oscillator 1.

As described above, it is preferable that the radiation angle θ2 of the excitation light LL enlarged by the optical element 41 is equal to or greater than 40°. It is preferable that the spectral line width of the excitation light LL emitted from the light source 221, that is, the excitation light LL enlarged by the optical element 41 is equal to or less than 100 MHz. With the radiation angle θ2 and the spectral line width in these ranges, it is possible to sufficiently increase the region where the excitation light LL enlarged by the optical element 41 interacts with the alkali metal atoms, and to reduce the line width of the EIT signal. For this reason, it is possible to further improve the oscillation characteristics.

As described above, in this embodiment, the substrate 28 which supports the light source 221 is provided, and the optical element 41 is provided on the side of the substrate 28 on which the light source 221 is provided. That is, the light source 221 is provided between the substrate 28 as a support portion and the optical element 41. With this, it is possible to use the substrate 28 as an alignment member for setting the relative positions of the light source 221 and the optical element 41. For this reason, it is possible to easily align the optical element 41 and the light source 221 in the direction of the optical axis (a) (in the direction intersecting the arrangement direction of the optical element 41 and the light source 221). As a result, it is possible to easily and accurately provide the optical element 41 and the light source 221 with respect to the atomic cell 21.

Second Embodiment

Next, a second embodiment of the present disclosure will be described.

Figure 7:
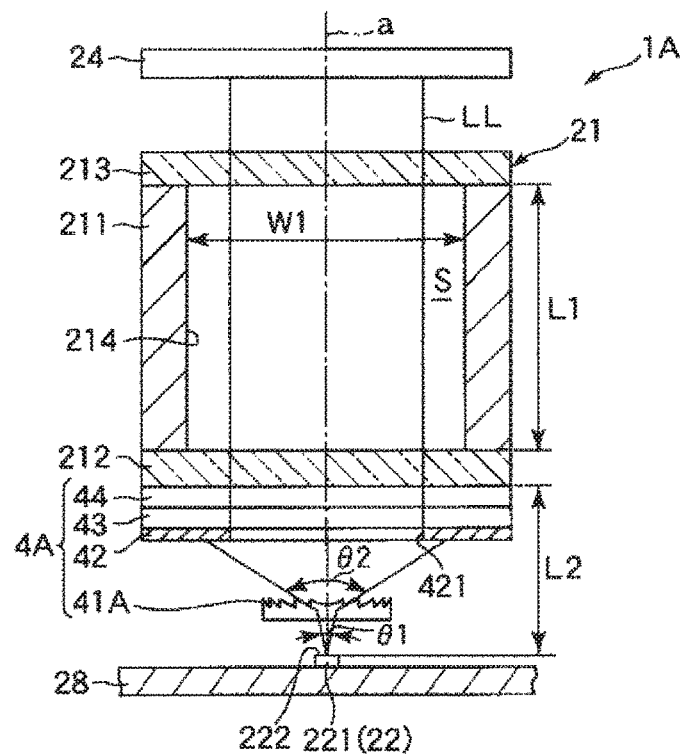
FIG. 7 is a schematic of a sectional view of a light source, an optical system, an atomic cell, and a light detection unit of an atomic oscillator provided with a quantum interference device according to a second embodiment of the present disclosure.

FIG. 7 is a schematic showing a light source, an optical system, an atomic cell, and a light detection unit of an atomic oscillator provided with a quantum interference device according to the second embodiment of the present disclosure. Hereinafter, for convenience of description, the top side of FIG. 7 is referred to as "top" and the bottom side is referred to as "bottom".

The atomic oscillator of this embodiment is the same as in the above-described first embodiment, except that an optical element is different.

In the following description, the second embodiment will be described focusing on differences from the above-described embodiment, and description of the same matters will not be repeated. In FIG. 7, the same configurations as those in the above-described embodiment are represented by the same reference numerals.

As shown in FIG. 7, an optical system 4A of an atomic oscillator LA has an optical element 41A which is a Fresnel lens, a light blocking member 42, and optical components 43 and 44.

The optical element 41A is a Fresnel lens, whereby it is possible to further reduce the thickness of the optical element 41A, and to enlarge the radiation angle θ1 of the excitation light LL. For this reason, it is possible to further reduce the size of the atomic oscillator LA. In a case where, for example, a laser, such as a semiconductor laser, which emits light having high directivity is used as the light source 221, it is possible to enlarge the radiation angle θ1 while maintaining directivity. For this reason, it is possible to increase the intensity of the EIT signal while reducing the line width of the EIT signal. As a result, it is possible to improve the short term frequency characteristics and to further improve the oscillation characteristics.

Even with the atomic oscillator 1A, as in the first embodiment, it is possible to achieve compactness and to exhibit excellent oscillation characteristics.

Third Embodiment

Next, a third embodiment of the present disclosure will be described.

Figure 8:
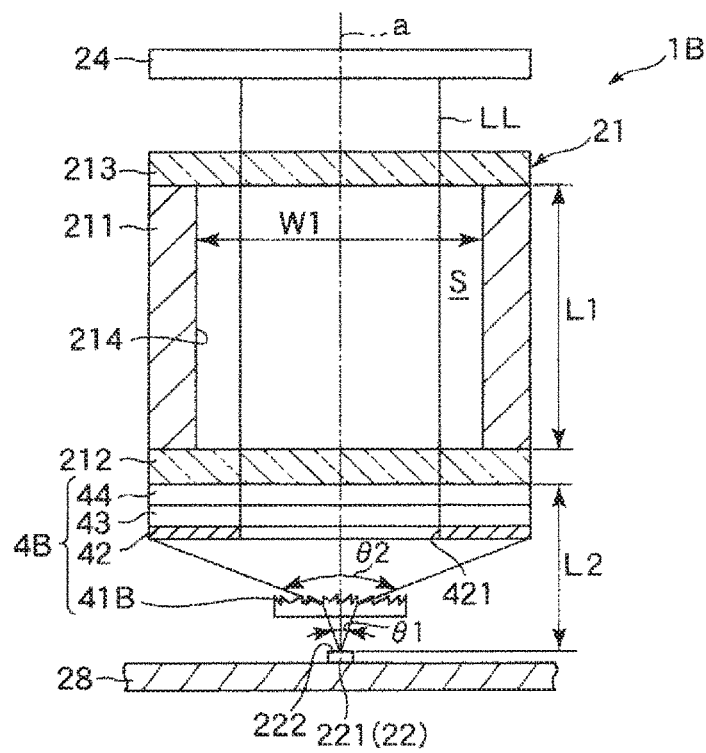
FIG. 8 is a schematic of a sectional view of a light source, an optical system, an atomic cell, and a light detection unit of an atomic oscillator provided with a quantum interference device according to a third embodiment of the present disclosure.

FIG. 8 is a schematic view showing a light source, an optical system, an atomic cell, and a light detection unit of an atomic oscillator provided with a quantum interference device according to the third embodiment of the present disclosure. Hereinafter, for convenience of description, the top side of FIG. 8 is referred to as "top" and the bottom side is referred to as "bottom".

The atomic oscillator of this embodiment is the same as in the above-described first embodiment, except that an optical element is different.

In the following description, the third embodiment will be described focusing on differences from the above-described embodiments, and description of the same matters will not be repeated. In FIG. 8, the same configurations as those in the above-described embodiments are represented by the same reference numerals.

As shown in FIG. 8, an optical system. 4B of an atomic oscillator 1B of this embodiment has an optical element 41B, which is a light diffusion plate, a light blocking member 42, and optical components 43 and 44.

The light diffusion plate is a plate-shaped member that diffuses the excitation light LL to a member having light transmittance. The light diffusion plate is not limited to a plate shape, and may be a sheet shape, a film shape, or the like.

The optical element 41B is a light diffusion plate, whereby it is possible to further reduce the thickness of the optical element 41B, and to enlarge the radiation angle θ1 of the excitation light LL. For this reason, it is possible to bring the optical element 41B closer to the atomic cell 21. From this, it is possible to further reduce the size of the atomic oscillator 1B.

In particular, it is preferable that a light shaping diffuser (LSD) is used as the optical element 41B. A minute and random lens array is formed on the surface of the light shaping diffuser, whereby it is possible to freely design the radiation angle θ2. With this, it is possible to make the radiation angle θ2 equal to or greater than 90° or to make the diameter (width) of the excitation light LL larger than the width W1 of the internal space S of the atomic cell 21. For this reason, it is possible to make the excitation light LL with less change in energy density incident in the atomic cell 21.

Even with the atomic oscillator 1B, as in the first embodiment, it is possible to achieve compactness and to exhibit excellent oscillation characteristics.

Fourth Embodiment

Next, a fourth embodiment of the present disclosure will be described.

Figure 9:
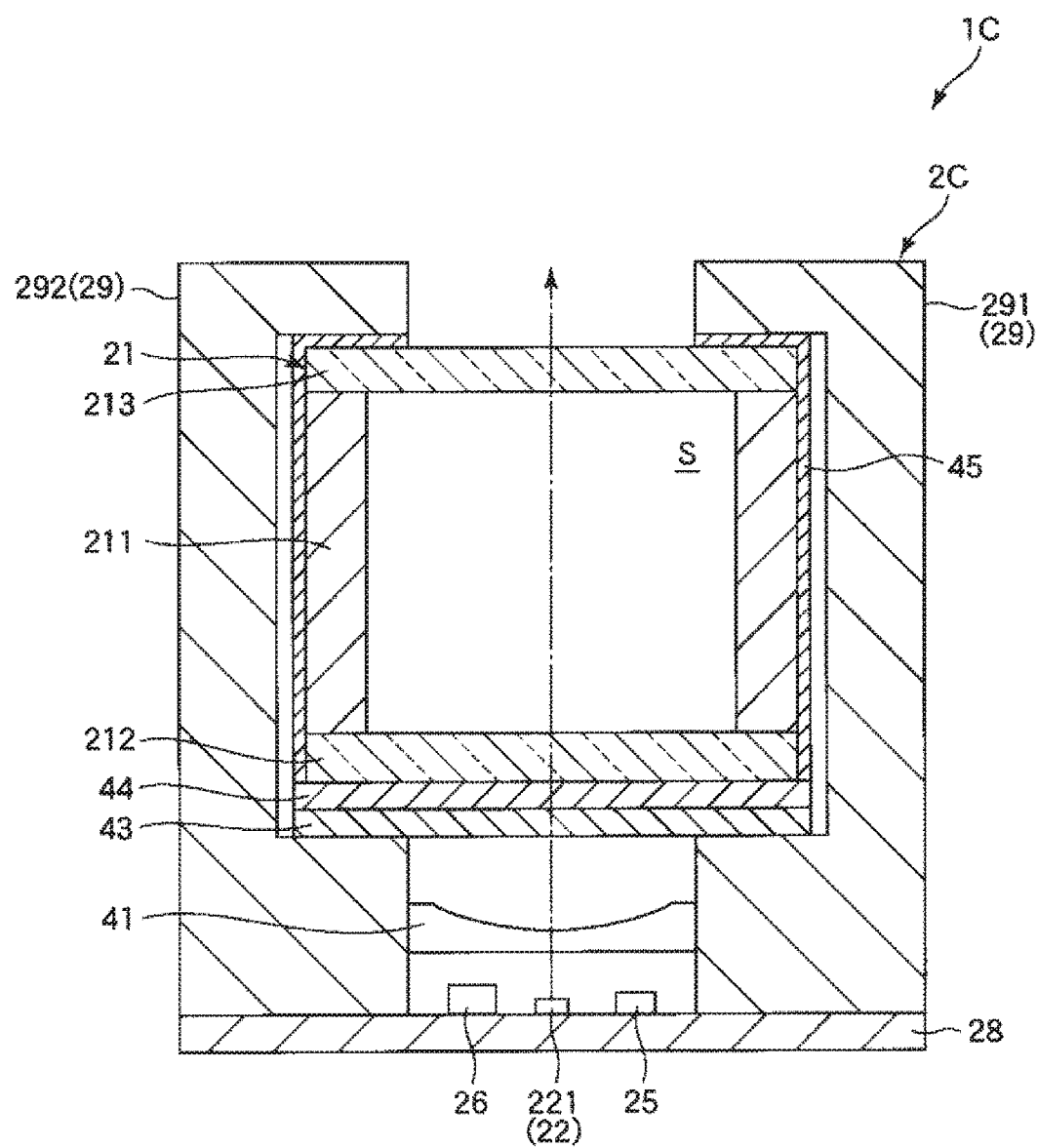
FIG. 9 is a schematic of a sectional view of an atomic cell unit of an atomic oscillator provided with a quantum interference device according to a fourth embodiment of the present disclosure.

FIG. 9 is a sectional view showing the schematic configuration of an atomic cell unit of an atomic oscillator provided with a quantum interference device according to the fourth embodiment of the present disclosure. Hereinafter, for convenience of description, the top side of FIG. 9 is referred to as "top" and the bottom side is referred to as "bottom".

The atomic oscillator of this embodiment is the same as in the above-described first embodiment, except that a light blocking member is additionally provided.

In the following description, the fourth embodiment will be described focusing on differences from the above-described embodiments, and description of the same matters will not be repeated. In FIG. 9, the same configurations as those in the above-described embodiments are represented by the same reference numerals.

As shown in FIG. 9, an atomic cell unit 2C of an atomic oscillator 1C of this embodiment has a light blocking member 45.

The light blocking member 45 is provided on the outer surface of the body portion 211 of the atomic cell 21. The light blocking member 45 is also provided in a portion excluding a region, through which the excitation light LL passes, on the outer surface of the light transmissive portion 213 of the atomic cell 21.

The light blocking member 45 has a film shape like the light blocking member 42. A material forming the light blocking member 45 is not particularly limited as long as the material has a light blocking property. For example, a resin material, a metal material, or the like can be used. The light blocking member 45 can be formed on the body portion 211 and the light transmissive portion 213 using a known film deposition method. It is preferable that the light blocking member 45 absorb the excitation light LL. With this, it is possible to reduce an adverse effect of unnecessary excitation light LL out of the excitation light LL incident in the atomic cell 21 on the EIT signal. In providing the light blocking member 45 for absorbing the excitation light LL, the light blocking member 45 may be formed of, for example, black or a dark color.

The light blocking member 45 is provided, whereby it is possible to reduce an adverse effect of unnecessary excitation light LL out of the excitation light LL incident in the atomic cell 21 on the EIT signal. As a result, it is possible to reduce the line width of the EIT signal. In this embodiment, although the light blocking member 42 in the first embodiment is omitted, the light blocking member 42 may be provided as in the first embodiment.

Even with the atomic oscillator 1C, as in the first embodiment, it is possible to achieve compactness and to exhibit excellent oscillation characteristics.

Fifth Embodiment

Next, a fifth embodiment of the present disclosure will be described.

Figure 10:
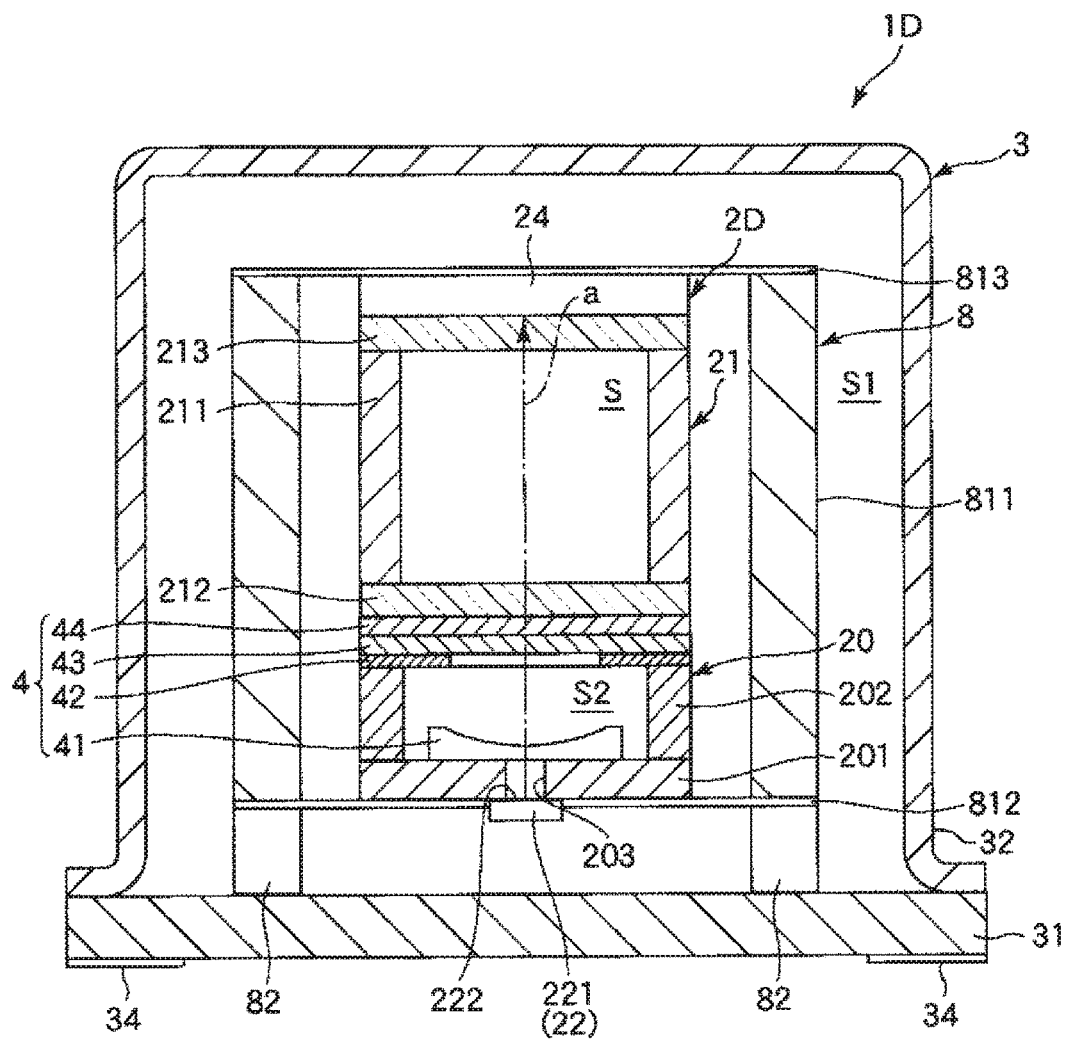
FIG. 10 is a schematic of a sectional view of an atomic oscillator provided with a quantum interference device according to a fifth embodiment of the present disclosure.

FIG. 10 is a sectional view showing the schematic configuration of an atomic oscillator provided with a quantum interference device according to the fifth embodiment of the present disclosure. Hereinafter, for convenience of description, the top side of FIG. 10 is referred to as "top" and the bottom side is referred to as "bottom".

The atomic oscillator of this embodiment is the same as in the above-described first embodiment, except that the configurations of an atomic cell unit and a support member are different.

In the following description, the fifth embodiment will be described focusing on differences from the above-described embodiments, and description of the same matters will not be repeated. In FIG. 10, the same configurations as those in the above-described embodiments are represented by the same reference numerals.

As shown in FIG. 10, an atomic oscillator 1D of this embodiment is provided with a package 3, an atomic cell unit 2D, and a support member 8, which supports the atomic cell unit 2D with respect to the package 3.

Atomic Cell Unit

The atomic cell unit 2D includes an atomic cell 21, a light emission unit 22 having a light source 221, an optical system. 4, a light detection unit 24, and a spacer 20, and these are formed into a unit. Though not shown, a heater and a temperature sensor are provided at arbitrary locations of the atomic cell unit 2D, such as on the spacer 20.

Spacer

The spacer 20 has a substrate 201 as a support portion, and a frame portion 202 which stands on the outer circumferential portion of the substrate 201. In the top end portion of the frame portion 202, the light blocking member 42 and the optical components 43 and 44 of the optical system 4 are provided. In this way, the top of the spacer 20 is closed by the light blocking member 42 and the optical components 43 and 44, whereby a space S2 is formed. In the space S2, the optical element 41 is provided.

The atomic cell 21 is connected onto the optical component 44, and the light detection unit 24 is connected to the top surface of the atomic cell 21 through an adhesive (not shown).

The substrate 201 has a hole 203 passing therethrough in a thickness direction in the center portion thereof.

On the bottom surface of the substrate 201, the light source 221 is provided so as to close the lower opening of the hole 203. The light source 221 is attached to the substrate 201 such that the light emitting surface 222 turns toward the substrate 201 side. With this, the excitation light LL is emitted toward the atomic cell 21 through the hole 203.

The optical element 41 is attached to the top surface of the substrate 201 so as to close the upper opening of the hole 203.

In this way, the optical element 41 is provided on the top surface of the substrate 201, and the light source 221 is provided on the bottom surface of the substrate 201. That is, the substrate 201 is provided between the light source 221 and the optical element 41, and is a support portion to support the light source 221 and the optical element 41. With this, it is possible to use the substrate 201 as a spacer which sets the distance between the optical element 41 and the light source 221. For this reason, it is possible to easily set the relative positional relationship between the optical element 41 and the light source 221 in the arrangement direction of the optical element 41 and the light source 221. As a result, it is possible to easily and accurately provide the optical element 41 and the light source 221 with respect to the atomic cell 21.

The substrate 201 has wirings (not shown) which are electrically connected to the light source 221.

Support Member

The support member 8 has a frame body 811, two sheet members 812 and 813, and leg portions 82.

The frame body 811 has a tubular shape, is provided to be separated from the atomic cell unit 2, and surrounds the outer circumference of the atomic cell unit 2.

A plurality of sheet members 812 and 813 are, for example, flexible wiring boards. The sheet member 812 has a center portion connected to the light source 221 and an outer circumferential portion connected to the frame body 811. The sheet member 813 has a center portion connected to the light detection unit 24 and an outer circumferential portion connected to the frame body 811.

A plurality of leg portions 82 are connected to the bottom end portion of the frame body 811, and support the frame body 811 with respect to the base 31.

The light source 221 is electrically connected to the sheet member 812, and the light detection unit 24 is electrically connected to the sheet member 813. The sheet members 812 and 813 are electrically connected to the base 31 through wirings (not shown).

Even with the atomic oscillator 1D, as in the first embodiment, it is possible to achieve compactness and to exhibit excellent oscillation characteristics.

In the atomic oscillator 1D, although a configuration in which the optical element 41 is provided on the top surface of the substrate 201 has been described, the optical element 41 and the substrate 201 may be integrally formed of the same material.

2. Electronic Apparatus

The atomic oscillator provided with the quantum interference device of the present disclosure described above can be incorporated in various electronic apparatuses.

Hereinafter, an example of an electronic apparatus which is provided with the atomic oscillator provided with the quantum interference device according to the present disclosure will be described.

Figure 11:
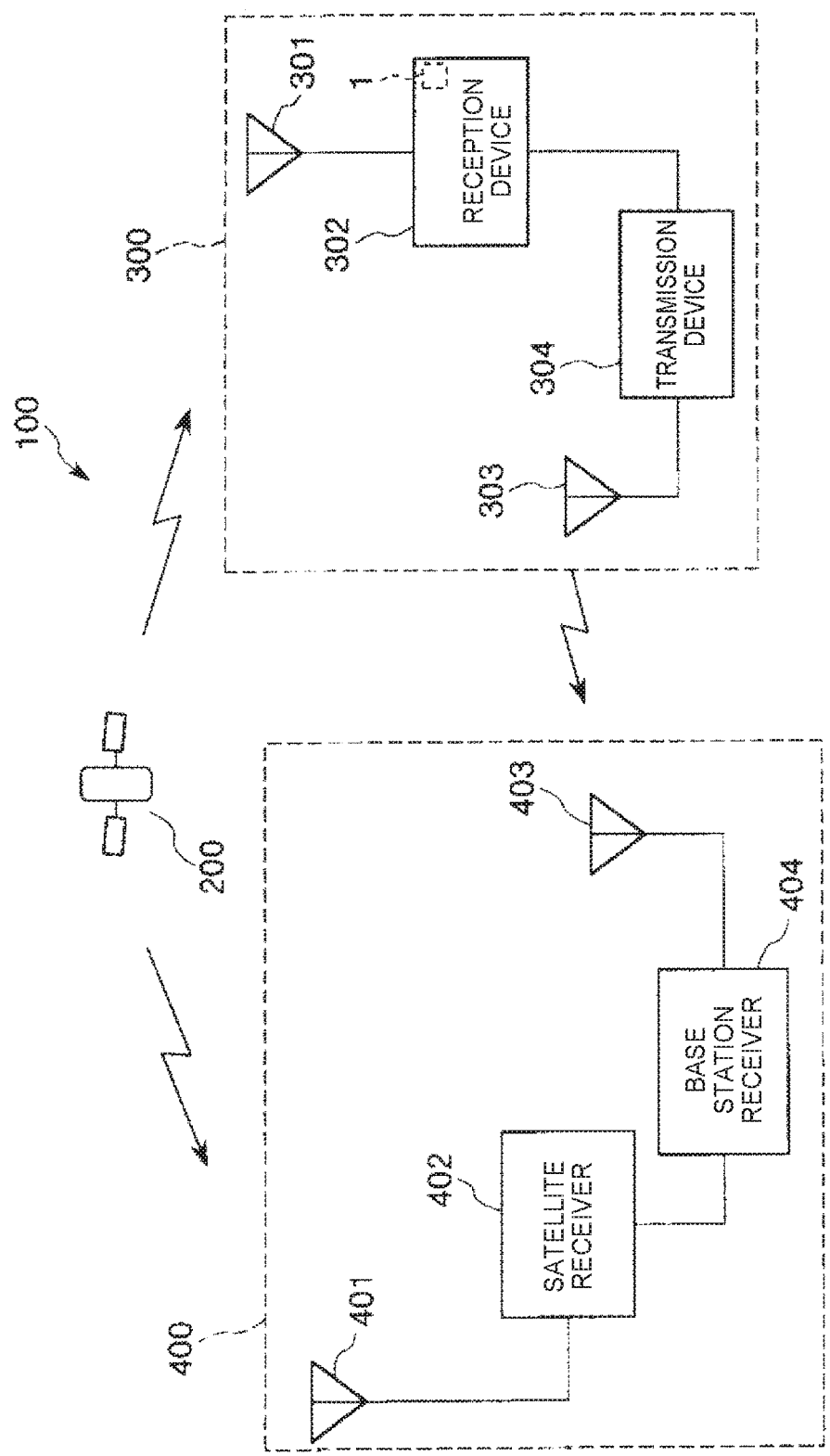
FIG. 11 is a schematic diagram showing an atomic oscillator provided with the quantum interference device in a positioning system using a GPS satellite according to the present disclosure.

FIG. 11 is a diagram showing a schematic configuration of the atomic oscillator provided with the quantum interference device according to the present disclosure is used in a positioning system using a GPS satellite.

A positioning system 100 shown in FIG. 11 includes a GPS satellite 200, a base station device 300, and a GPS reception device 400.

The GPS satellite 200 transmits positioning information (GPS signal).

The base station device 300 is provided with a reception device 302 and a transmission device 304. The reception device 302 receives the positioning information from the GPS satellite 200 through an antenna 301 provided, for example, at an electronic reference point (GPS continuous observation station) with high accuracy. The transmission device 304 transmits the positioning information received by the reception device 302 through an antenna 303.

The reception device 302 is an electronic apparatus that includes the atomic oscillator 1 of the present disclosure as a reference frequency oscillation source. The reception device 302 has excellent reliability. The positioning information received by the reception device 302 is transmitted by the transmission device 304 in real time.

The GPS reception device 400 is provided with a satellite receiver 402 which receives the positioning information from the GPS satellite 200 through an antenna 401, and a base station receiver 404 which receives the positioning information from the base station device 300 through an antenna 403.

Since the reception device 302, which is an example of an electronic apparatus is provided with the atomic oscillator 1 provided with the quantum interference device of the present disclosure, it is possible to exhibit excellent reliability.

The electronic apparatus of the present disclosure is not limited to that described above, and can be applied to, for example, a smartphone, a tablet terminal, a timepiece, a mobile phone, a digital still camera, an ink jet ejection apparatus (for example, an ink jet printer), a personal computer (a mobile personal computer or a laptop personal computer), a television, a video camera, a video tape recorder, a car navigation system, a pager, an electronic organizer (including one with a communication function), an electronic dictionary, an electronic calculator, an electronic game machine, a word processor, a work station, a video phone, a security television monitor, electronic binoculars, a POS terminal, medical equipment (for example, an electronic thermometer, a blood pressure monitor, a blood glucose monitor, an electrocardiographic apparatus, an ultrasound diagnostic apparatus, or an electronic endoscope), a fish-finder, a variety of measurement instrument, meters (for example, meters of a vehicle, an airplane, or a ship), a flight simulator, a terrestrial digital broadcasting system, a mobile phone base station, or the like.

3. Vehicle

The atomic oscillator provided with the quantum interference device of the present disclosure described above can be incorporated in various vehicles.

Hereinafter, an example of a vehicle according to an embodiment of the present disclosure will be described.

Figure 12:
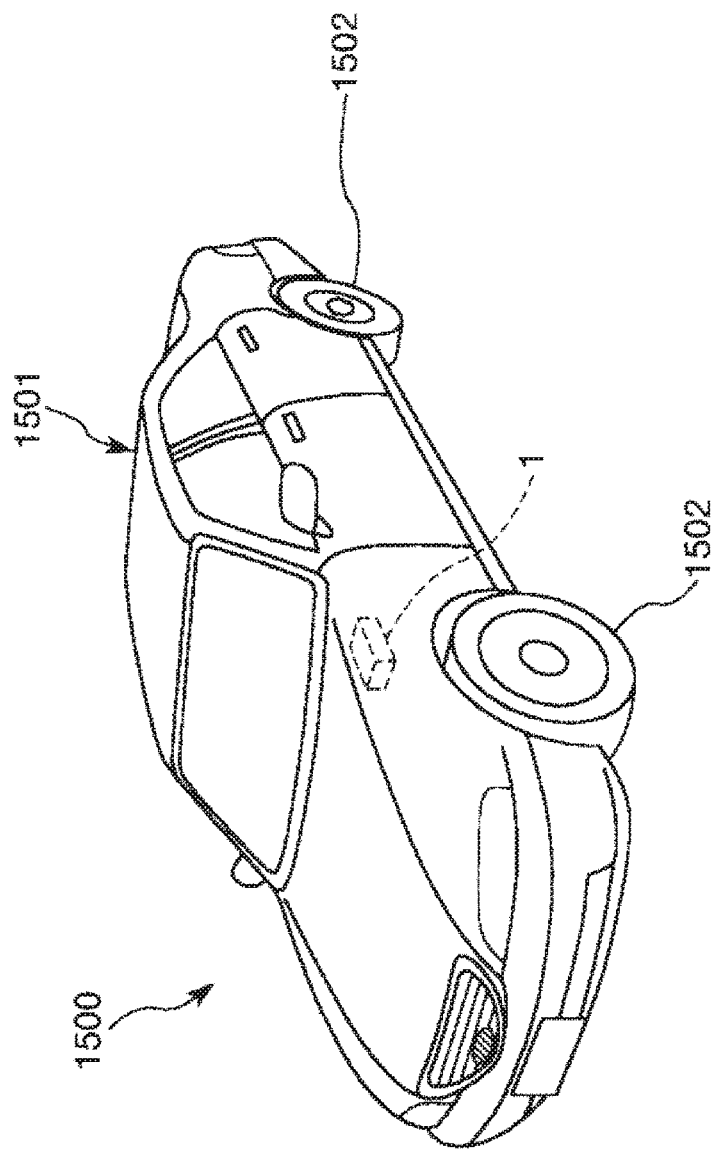
FIG. 12 is a perspective view showing the configuration of a vehicle (car) which is provided with an atomic oscillator provided with the quantum interference device according to the present disclosure.

FIG. 12 is a perspective view showing the configuration of a vehicle (car) which is provided with an atomic oscillator provided with the quantum interference device of the present disclosure.

A vehicle 1500 shown in FIG. 12 has a vehicle body 1501 and four wheels 1502, and is configured such that the wheels 1502 are rotated by a power source (engine) (not shown) provided in the vehicle body 1501. The atomic oscillator 1 is embedded in the vehicle 1500. Then, for example, a control unit (not shown) controls driving of the power source in response to an oscillation signal from the atomic oscillator 1.

Since such a vehicle is provided with the atomic oscillator 1 provided with the quantum interference device of the present disclosure, it is possible to exhibit excellent reliability.

Although the quantum interference device, the atomic oscillator, the electronic apparatus, and the vehicle of the present disclosure have been described based on the illustrated embodiments, the present disclosure is not limited thereto, and for example, the respective components of the foregoing embodiment may be replaced with arbitrary components having the same functions, or arbitrary components may be added.

In the above-described embodiments, although an example where the quantum interference device according to an embodiment of the present disclosure is used to the atomic oscillator using the electromagnetically induced transparency (EIT) phenomenon has been described, the quantum interference device according to an embodiment of the present disclosure is not limited thereto, and may be applied to, for example, an atomic oscillator using a double resonance method, an oscillator other than a quartz oscillator, or the like.

What is claimed is:

1. A quantum interference device comprising:
   an atomic cell that has alkali metal atoms disposed therewithin, the atomic cell having an incident surface and an emission surface that are opposite to each other, an internal space of the atomic cell having an inner width;
   a light source that emits light toward the incident surface of the atomic cell to excite the alkali metal atoms in the atomic cell, an optical axis of the light crossing the inner width;
   an optical element disposed between the light source and the incident surface of the atomic cell, wherein the optical element increases a radiation angle of the light emitted from the light source; and
   a light detector that detects light transmitted from the emission surface of the atomic cell through the atomic cell,
   wherein a beam diameter of the light at a side of the incident surface is greater than the inner width of the atomic cell.

2. The quantum interference device according to claim 1, further comprising:
   a light blocking member disposed between the optical element and the incident surface of the atomic cell, wherein the light blocking member blocks a portion of the light in which the radiation angle of the light is increased by the optical element.

3. The quantum interference device according to claim 1, further comprising:
   a quarter-wave plate disposed between the incident surface of the atomic cell and the optical element.

4. The quantum interference device according to claim 1, further comprising:
   a support that supports the light source, wherein the light source is disposed between the support and the optical element.

5. The quantum interference device according to claim 1, further comprising:
   a support that supports the light source, wherein the support is disposed between the light source and the optical element.

6. The quantum interference device according to claim 1, wherein the optical element is a concave lens.

7. The quantum interference device according to claim 1, wherein the optical element is a Fresnel lens.

8. The quantum interference device according to claim 1, wherein the optical element is a light diffusion plate.

9. The quantum interference device according to claim 1, wherein a distance between a light emitting surface of the light source and the incident surface of the atomic cell is greater than or equal to 0.3 mm and less than or equal to 2.0 mm.

10. The quantum interference device according to claim 1, wherein the optical element increases the radiation angle of the light emitted from the light source by at least 40°.

11. The quantum interference device according to claim 1, wherein the optical element increases a spectral line width of the light emitted from the light source by a value less than or equal to 100 MHz.

12. The quantum interference device according to claim 10, wherein the optical element increases a spectral line width of the light emitted from the light source by a value less than or equal to 100 MHz.

13. An atomic oscillator comprising:
the quantum interference device according to claim 1,
a clock generator that is configured to output a clock signal; and
a controller configured to make the clock generator generate the clock signal based on a signal from the light detector.

14. An electronic apparatus comprising:
a signal receiver that is configured to receive an external signal;
the quantum interference device according to claim 1, the quantum interference device being assembled in the signal receiver; and
a case that houses the signal receiver.

15. A vehicle comprising:
the quantum interference device according to claim 1; and
a movable body that houses the quantum interference device.

* * * * *